United States Patent
Miller et al.

(10) Patent No.: US 7,694,246 B2
(45) Date of Patent: Apr. 6, 2010

(54) TEST METHOD FOR YIELDING A KNOWN GOOD DIE

(75) Inventors: Charles A. Miller, Fremont, CA (US); Timothy E. Cooper, Discovery Bay, CA (US); Yoshikazu Hatsukano, Minato-ku (JP)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/177,367

(22) Filed: Jun. 19, 2002

(65) Prior Publication Data

US 2003/0237061 A1     Dec. 25, 2003

(51) Int. Cl.
*G06F 17/50*     (2006.01)
(52) U.S. Cl. .............................. 716/4; 716/1
(58) Field of Classification Search .............. 716/4–6, 716/1; 324/754–762, 765; 438/106, 660
See application file for complete search history.

(56) References Cited

U.S. PATENT DOCUMENTS

| | | | |
|---|---|---|---|
| 4,899,107 A | 2/1990 | Corbett et al. | |
| 5,012,187 A | 4/1991 | Littlebury | |
| 5,073,117 A | 12/1991 | Malhi et al. | |
| 5,123,850 A | 6/1992 | Elder et al. | |
| 5,131,535 A | 7/1992 | O'Connor et al. | |
| 5,302,891 A | 4/1994 | Wood et al. | |
| 5,772,451 A | 6/1998 | Dozier, II et al. | |
| 5,815,000 A * | 9/1998 | Farnworth et al. | 324/755 |
| 5,825,195 A * | 10/1998 | Hembree et al. | 324/765 |
| 5,838,163 A * | 11/1998 | Rostoker et al. | 324/763 |
| 5,841,291 A * | 11/1998 | Liu et al. | 324/755 |
| 5,847,571 A * | 12/1998 | Liu et al. | 324/754 |
| 6,002,266 A * | 12/1999 | Briggs et al. | 324/758 |
| 6,033,935 A | 3/2000 | Dozier, II et al. | |

(Continued)

FOREIGN PATENT DOCUMENTS

JP     03-131048     6/1991

(Continued)

OTHER PUBLICATIONS

Kost D., "Motorola Fast Static RAM Known Good Die Manufacturing Process" 1997 International Conference on Multichip Modules, 0-7803-3787-5/97 1997 IEEE, pp. 245-249, Motorola, 3501 Ed blustein Bouldvard, Austin, TX 78721.

(Continued)

*Primary Examiner*—Jack Chiang
*Assistant Examiner*—Binh C Tat
(74) *Attorney, Agent, or Firm*—N. Kenneth Burraston

(57) ABSTRACT

A semiconductor wafer is cut to singulate integrated circuit dice formed on the wafer. A die pick machine then positions and orients the singulated dice on a carrier base such that signal, power and ground pads formed on the surface of each die reside at predetermined positions relative to landmarks on the carrier base the die pick machine optically identifies. With the dice temporarily held in place on the carrier base, they are subjected to a series of testing and other processing steps. Since each die's signal pads reside in predetermined locations, they can be accessed by appropriately arranged probes providing test equipment with signal access to the pads during tests. After each test, a die pick machine may replace any die that fails the test with another die, thereby improving efficiency of subsequent testing and other processing resources.

16 Claims, 8 Drawing Sheets

U.S. PATENT DOCUMENTS

| | | | | |
|---|---|---|---|---|
| 6,064,213 | A * | 5/2000 | Khandros et al. | 324/754 |
| 6,114,869 | A * | 9/2000 | Williams et al. | 324/765 |
| 6,131,255 | A * | 10/2000 | Atkins et al. | 29/25.01 |
| 6,219,908 | B1 | 4/2001 | Farnworth et al. | |
| 6,232,149 | B1 | 5/2001 | Dozier, II et al. | |
| 6,246,247 | B1 * | 6/2001 | Eldridge et al. | 324/761 |
| 6,337,576 | B1 * | 1/2002 | Wiggin et al. | 324/763 |
| 6,384,613 | B1 * | 5/2002 | Cheng et al. | 324/754 |
| 6,427,222 | B1 * | 7/2002 | Shau | 716/4 |
| 6,465,264 | B1 | 10/2002 | Kohno et al. | |
| 6,483,328 | B1 * | 11/2002 | Eldridge et al. | 324/754 |
| 6,534,856 | B1 | 3/2003 | Dozier, II et al. | |
| 6,586,955 | B2 * | 7/2003 | Fjelstad et al. | 324/754 |
| 6,622,289 | B2 * | 9/2003 | Saunders et al. | 716/4 |
| 6,624,648 | B2 * | 9/2003 | Eldridge et al. | 324/761 |
| 6,627,483 | B2 | 9/2003 | Ondricek et al. | |
| 6,636,063 | B2 * | 10/2003 | Arnold et al. | 324/762 |
| 6,642,625 | B2 | 11/2003 | Dozier, II et al. | |
| 6,644,982 | B1 | 11/2003 | Ondricek et al. | |
| 6,669,489 | B1 | 12/2003 | Dozier, II et al. | |
| 6,707,311 | B2 * | 3/2004 | Hohenwarter | 324/761 |
| 6,720,574 | B2 * | 4/2004 | Arnold et al. | 257/48 |
| 6,750,136 | B2 * | 6/2004 | Zhou et al. | 438/617 |
| 6,791,171 | B2 * | 9/2004 | Mok et al. | 257/678 |
| 6,806,494 | B2 * | 10/2004 | Fenner et al. | 257/48 |
| 6,812,718 | B1 * | 11/2004 | Chong et al. | 324/754 |
| 6,853,042 | B2 * | 2/2005 | Yoshida et al. | 257/432 |
| 6,887,723 | B1 | 5/2005 | Ondricek et al. | |
| 6,913,468 | B2 | 7/2005 | Dozier, II et al. | |
| 6,920,689 | B2 | 7/2005 | Khandros et al. | |
| 7,059,047 | B2 | 6/2006 | Dozier, II et al. | |
| 7,202,677 | B2 | 4/2007 | Pedersen et al. | |
| 7,217,580 | B2 | 5/2007 | Ondricek et al. | |
| 7,330,039 | B2 | 2/2008 | Khandros et al. | |
| 2001/0055905 | A1 * | 12/2001 | Tezuka | 439/488 |
| 2002/0004320 | A1 | 1/2002 | Pedersen et al. | |
| 2006/0223345 | A1 | 10/2006 | Dozier, II et al. | |
| 2007/0269909 | A1 | 11/2007 | Ondricek et al. | |
| 2007/0285114 | A1 | 12/2007 | Pedersen et al. | |

FOREIGN PATENT DOCUMENTS

| | | |
|---|---|---|
| JP | 03-257383 | 11/1991 |
| JP | 05-036793 | 2/1993 |
| JP | 06-244253 | 9/1994 |
| JP | 10-098083 | 4/1998 |
| JP | 2000-097990 | 4/2000 |
| JP | 2001-004699 | 1/2001 |
| JP | 2001-228206 | 8/2001 |
| JP | 2001-330626 | 11/2001 |
| JP | 2002-134572 | 5/2002 |
| JP | 2001091576 A | 4/2006 |

OTHER PUBLICATIONS

Hitachi LTD., "Method Of Manufacturing Semiconductor Device" Patent Abstracts of Japan, Publication No. 2001091576, Publication Date Jun. 4, 2001, Application Date: Sep. 27, 1999, U.S. Appl. No. 11/271,803.

Fry et al., "In-Line KGD Test Speeds Flip Chip Assembly," (Micro-ASI, Inc. Feb. 1, 2001), 5 pages.

U.S. Appl. No. 12/030,037, filed Feb. 12, 2008, Khandros et al.

* cited by examiner

TEST METHOD FOR YIELDING A KNOWN GOOD DIE

BACKGROUND OF THE INVENTION

1. Field of the Invention

The present invention relates in general to integrated circuit (IC) fabrication and testing processes and in particular to the use of a carrier for holding an array of IC dice during testing and other processing steps.

2. Description of Related Art

FIG. 1 illustrates a typical prior art process flow for fabricating, packaging and testing ICs having embedded repairable random access memories (RAMs). A RAM includes rows and columns of cells for storing data, and a laser-repairable RAM includes spare rows or columns that can be used to replace rows or columns containing defective cells. When an IC chip containing a laser-repairable memory has a defective row or column, a laser alters the IC chip by cutting selected fuses on the surface of the IC so that the IC uses a spare row or column in lieu of the defective row or column.

In the process flow depicted in FIG. 1, the ICs are initially fabricated as an array of IC dice on a semiconductor wafer (step 10). The laser-repairable memory embedded in each IC is then tested before the IC dice are separated from the wafer (step 12). Some ICs include built-in self-test (BIST) circuits which automatically test their embedded memories and generate data at pads on the surfaces of the dice indicating which cells are defective. In such case a wafer-level IC tester employed at step 12 probes pads on the dice to acquire the data the BIST circuits within the dice produce during the test and to provide power and ground to the dice during the memory test. The IC tester may also perform other tests at step 12 such as, for example, parametric tests in which the current drawn at the IC's power terminals are measured. A laser repair system then processes the memory test data for each IC to determine which of its embedded memory rows or columns contain defective cells, determines how to allocate spare rows and columns to repair the memory, and then employs a laser to repair any defective memories (step 14). After repairing the defective memories, the memories may be again tested while the dice are still at the wafer level to ensure that the repair was effective (step 16). The dice may also be subjected to additional logic or parametric testing at this point.

The wafer is then cut to separate ("singulate") all of the dice (step 18), and the dice that pass the post-laser repair test at step 16 are installed in IC packages (step 20). The packaged ICs may then be subjected to additional screening tests (step 22), and the packaged ICs that pass those tests are then subjected to a burn-in process (step 24). The burn-in process applies thermal and electrical stresses to the ICs for a specified amount of time for the purpose of inducing marginally operable ICs having inherent defects to fail. Typically ICs are burn-in tested by placing them in circuit board sockets and then loading the circuit boards into a convection oven which elevates their temperature to stress them thermally. While the ICs are being heated, power supplies and test signal generators linked to their power and signal I/O terminals stress them electrically. After burn-in, the ICs undergo detailed final testing (step 26) including high frequency logic tests and other tests. During final testing the parts may be "binned" according to speed grade or other performance levels.

The process illustrated in FIG. 1 includes four separate testing steps 12, 16, 22 and 26. A wafer level tester carries out the tests at steps 12 and 16 before the dice are separated from one another and packaged so that only the dice that pass those tests are packaged. Some manufacturers merge the post laser memory testing step 16 into pre burn-in testing step 22 or eliminate pre burn-in testing step. But in doing so they encounter the added costs of packaging more defective dice or expending burn-in resources on dice that could have been classified as defective before they were subjected to burn-in. Since a wafer level IC tester must include a separate data input/output channel to communicate with each IC pad it accesses during a test, tests carried out at the wafer level are often limited to those requiring a tester to access only a relatively few pads on each IC. To carry out the tests at steps 22 and 24, the packaged ICs are typically installed in load boards that enable an IC tester to access all IC signal, power and ground pins of each packaged IC.

Die that are to be used, for example in flip-chip module (FCM) or hybrid modules are not separately packaged. In an FCM, a bare die is mounted directly on a substrate using solder balls, polymer balls, spring contacts or other means to conductively link pads on the IC dice to pads on the substrate. Some FCM manufacturers do not attempt to test dice after they have been singulated, but instead choose to test only the assembled FCM. However since a single defective dice renders the entire FCM defective, many manufacturers find it preferable to test singulated dice before they are incorporated into FCMs.

FIG. 2 is a process flow diagram illustrating a prior art process for producing known good dice to be installed in FCMs. After wafer fabrication, testing at the wafer level, and laser repair (step 28), and after the dice are singulated (step 30), a die pick machine picks up and places each IC that passes wafer level testing on a testing substrate (step 32) so that it may be subjected to pre burn-in testing (step 33). After the dice are subjected to burn-in (step 34), the die pick machine places dice on the testing substrate (step 35) so that it may be subjected to final testing (step 36. The known good dice are then installed in FCMs (step 37), and the FCMs are then tested (step 38).

This system ensures that only known good dice (KGD) are incorporated into FCMs and avoids the need for using individual carriers which can damage some of the dice and provides an interconnect system having impedance characteristics that can be much closer to that of the interconnect system that will later link the dice to the FCM substrate. However the need to separately handle each IC chip during the many processing steps occurring after singulation increases the cost and lowers the speed of the process.

FIG. 3 illustrates a "wafer-level" testing approach to providing KGD for incorporation into FCMs. After wafer fabrication, memory testing and laser repair (step 40), the dice are subjected to burn-in testing (step 41) and detailed final testing (step 42) while still in wafer form. The dice are then singulated (step 43) and the KGD are incorporated into FCMs (step 44) that are then tested (step 44). Note that in this process flow all processing and testing steps needed to identify the KGD are carried out at the wafer level before the dice are singulated.

This approach greatly reduces the number of processing steps because IC chips are not handled individually until the KGD are ready to be installed in the FCMs. However the system requires use of a general purpose wafer level IC tester at step 42 that can access all of the signal pads of all of the dice and conduct every type of test needed. Since the dice on a single wafer can collectively have a very large number of signal pads, it is usually not practical to provide a tester having a sufficient number of channels to access all of the signal pads concurrently. Therefore wafer level IC testers that carry out final high frequency functional and other tests on dice normally test only a limited number of the dice on a wafer concurrently. After a group of dice are tested, a chuck holding the wafer repositions the wafer so that the tester's probes can access pads of another group of dice to be tested.

One advantage of the wafer level process flow of FIG. 3 is that it does not require manipulation of individual dice until they are ready to be installed in FCMs. But the process flow of FIG. 3 has an inherent inefficiency not shared by the process flow of FIG. 2. In the process flow of FIG. 2, the memory and other pre-laser repair testing carried out at step 28 will often identify defective dice that cannot be laser repaired. Those dice are discarded after singulation at step 30 and are not further tested at step 33. Similarly dice that fail pre burn-in tests at step 33 can be discarded so that they do not needlessly consume burn-in resources at step 34 or final testing resources at step 36. The process flow of FIG. 3 may conduct analogous test and burn-in steps on the wafer level dice, but since the dice are not singulated until after all testing and burn-in steps are complete, it is not possible to discard dice found to be defective after each test. Thus all dice are subjected to all test and burn-in steps that may occurs even after some dice have been found to be defective. Such redundant testing of known defective dice is an inefficient use of test and burn-in resources and can be particularly problematic where dice yields are low.

What is needed is a die carrier permitting a process flow that makes efficient use of testing and burn-in resources while minimizing the amount of individual die manipulation, which does not damage the dice, and which can accurately position dice having closely spaced contacts with a high degree of accuracy despite any lack of uniformity in dice dimensions.

BRIEF SUMMARY OF THE INVENTION

A carrier in accordance with an embodiment of the invention holds an array of singulated dice during testing and processing. The carrier includes a base upon which a conventional die pick machine positions and orients each die relative to optically identified landmarks on the base so that signal pads or spring contacts formed on the upper surfaces of the dice are in proper alignment to be probed by test equipment. The carrier may include vacuum ports or an adhesive under the dice for temporarily holding the dice in place after the die pick machine positions them on the base.

After the die pick machine positions singulated dice cut from a wafer on the carrier, a sequence of processing steps including testing and burn-in may be carried out on the dice. After each test, a die pick machine may remove any die that failed the test from that carrier and replace it with a die that passed that test so that only those die that pass the test are subjected to subsequent tests or processing steps.

In one embodiment of the invention, the carrier includes a removable lid having a lower surface holding probes or pads linked to channels of an IC tester and arranged to the contact pads or spring contacts formed on the upper surfaces of dice when the lid is placed on the carrier. Alternatively the carrier may be left uncovered during testing so that other kinds of probe assemblies can access the pads or spring contacts on the dice surfaces.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF EXEMPLARY EMBODIMENTS OF THE INVENTION

The present invention relates to a system for testing and processing an array of singulated integrated circuit (IC) dice held on a carrier, and this specification describes one or more exemplary embodiments and applications of the invention considered by the applicants to be the best modes of practicing the invention. It is not intended, however, that the invention be limited to the exemplary embodiments described below or to the manner in which the embodiments operate.

Figure 1:
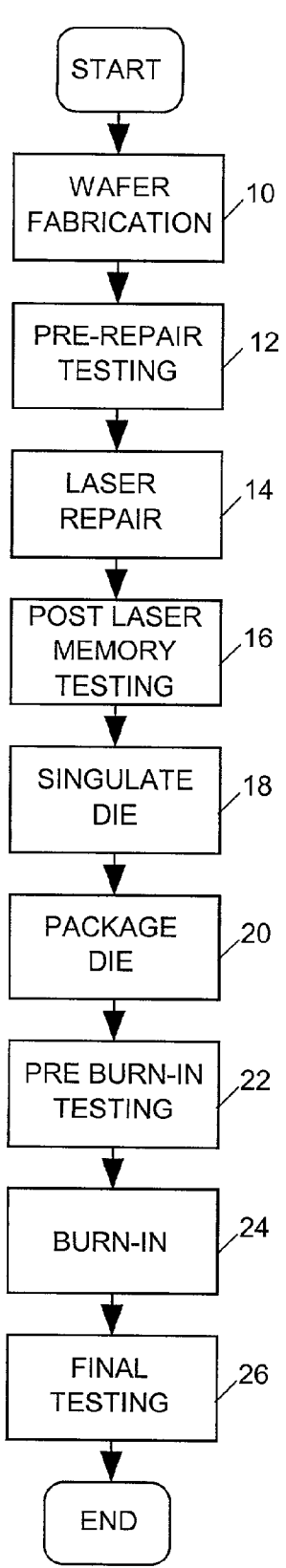
FIG. 1 is a process flow diagram illustrating a typical prior art process flow for fabricating, packaging and testing integrated circuit dice having embedded repairable random access memories (RAMs)
Figure 2:
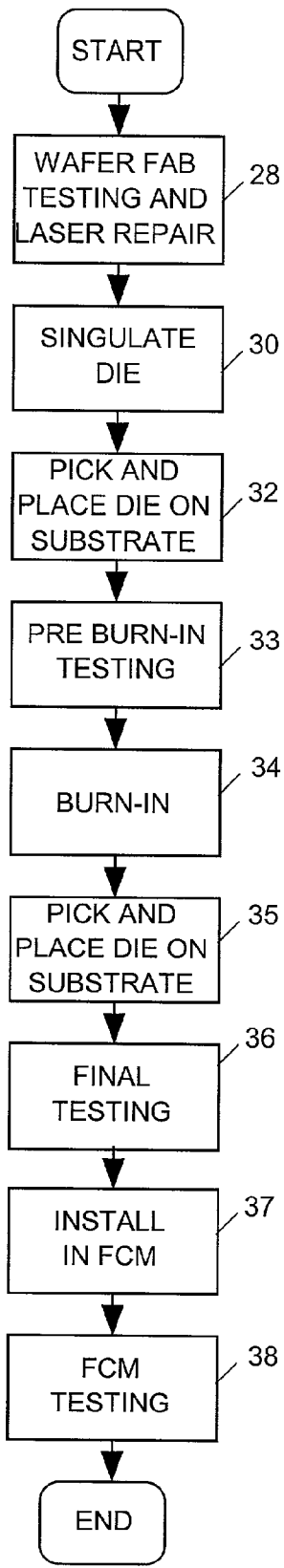
FIGS. 2 and 3 are process flow diagrams illustrating typical prior art processes for producing known good dice to be installed in flip-chip modules.
Figure 3:
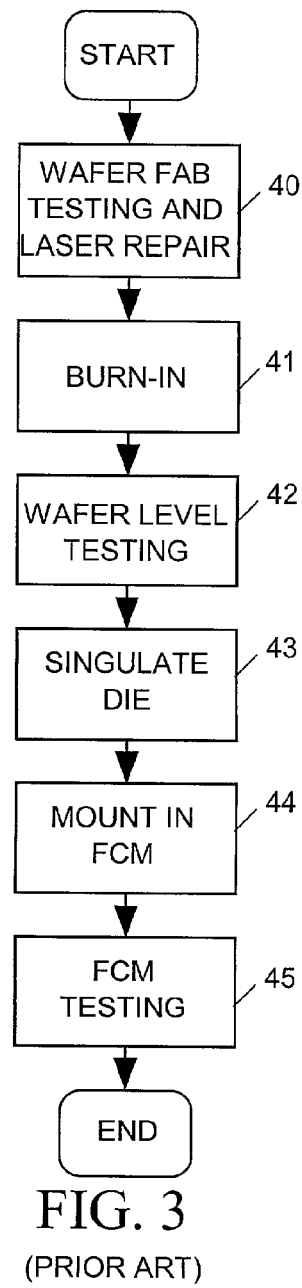
Figure 4:
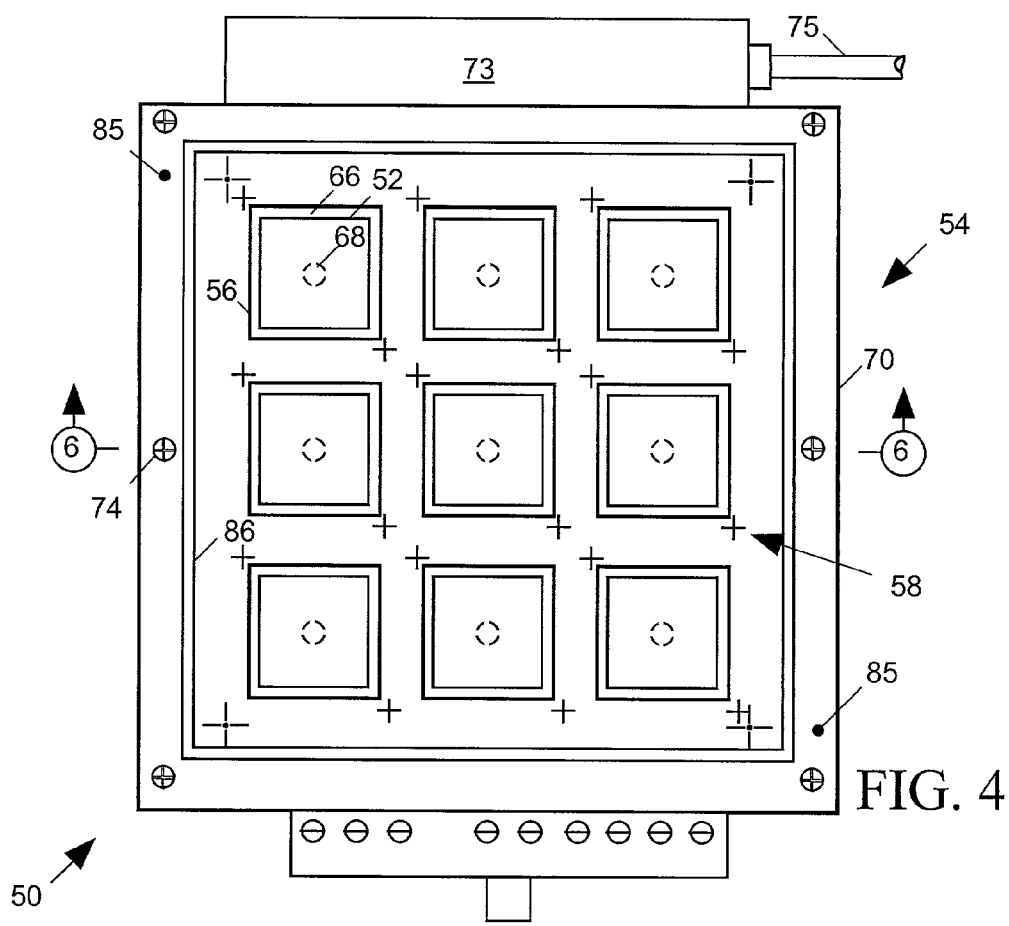
FIG. 4 is a top plan view of a die carrier in accordance with an exemplary embodiment of the invention.
Figure 5:
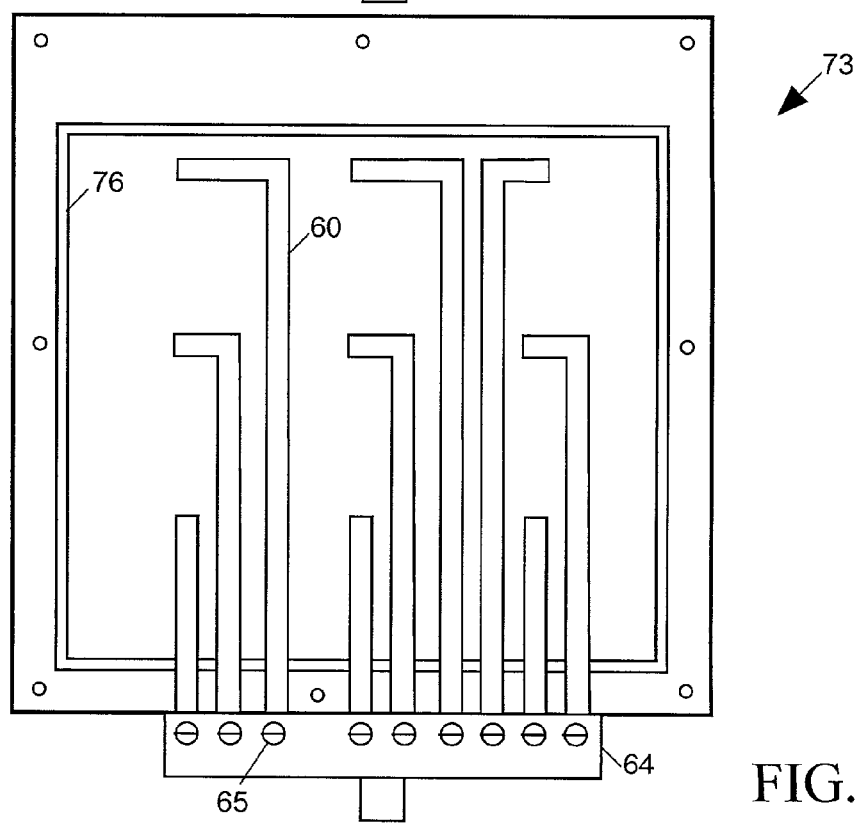
FIG. 5 is a sectional plan of the carrier of FIG. 4.
Figure 6:
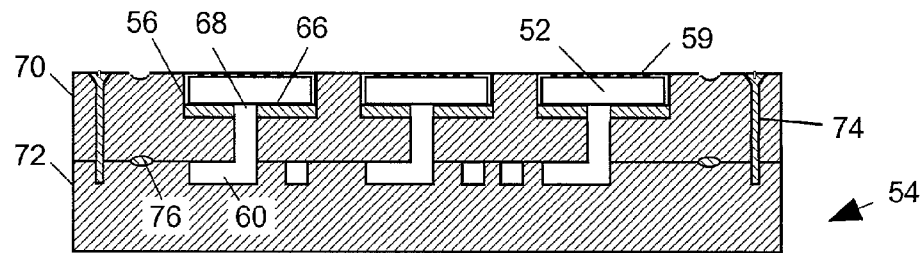
FIG. 6 is a sectional elevation view of the carrier of FIG. 4.

FIG. 4 is a top plan view of a silicon panel carrier 50 in accordance with an exemplary embodiment of the invention, and FIGS. 5 and 6 are sectional plan and elevation views, respectively, of the carrier of FIG. 4. Carrier 50 includes a base 54 having a 3×3 array of recesses 56, each having an upper opening and a planar bottom for holding a separate one of IC dice 52. While for simplicity, carrier 50 of FIGS. 4-6 is illustrated as having a 3×3 array of recesses 56, in other embodiments of the invention the carrier may be sized to accommodate larger or smaller recess arrays.

After dice 52 have been fabricated on a semiconductor wafer and after the wafer has been cut to singulate the dice (i.e., to separate them into individual IC chips), a conventional die pick machine places each die 52 within a separate one of recesses 56 with the die's lower surface resting on the planar bottom surface of the recess. Each die 52 includes a set of signal, power and ground pads 59 (FIG. 6) on its upper surface through which circuits formed within the dice communicate with external devices. The planar bottom surfaces of recesses reside in a common plane (i.e., they are "coplanar"), and when dice 52 are placed in the recesses, the pads on their upper surfaces reside in a common plane and are exposed near the top of the recesses 56. The base includes a set of landmarks 58 that can be optically identified by a suitably equipped conventional die pick machine.

Since wafer saws that singulate dice from wafers typically do not control the cut width or position of the cuts with high accuracy, the outline edge dimensions of the die surfaces can vary from die-to-die even when cut from the same wafer. Since the variation in die outline edge dimensions can be large compared to the native pitch of the pads 59 on the surface of the die, carrier 50 does not rely on sizing recesses 56 so that they mechanically align the dice so that their pads reside in predetermined positions within their common plane. Instead, the dimensions of the bottom surfaces of recesses 56 within their common plane are made substantially larger than the dimensions of the lower surfaces of dice 52 they hold. Over-sizing recesses 56 allows the die pick machine freedom to position and orient dice 52 within the recesses so that their pads 59 reside at predetermined positions within their common plane relative to optically identified positions of landmarks 58.

A separate channel 60 extends through base 54 from the bottom surface of each recess 56 to a valve header 64 that may be connected to a vacuum pump (not shown). Valve header 64 includes a separate valve 65 for each channel to allow independent control over the vacuum in each channel 60. After the die pick machine has suitably positioned a die 52 in one of recesses 56 relative to the identified landmarks 58, one of valves 65 is set to allow the vacuum pump to create a vacuum in the channel 60 leading to that recess to hold the die 52 in place. That valve 65 may then be set to retain the vacuum in the channel 60 even when the vacuum pump is disconnected from valve header 64. Each channel's valve 65 may also be set to release the vacuum in its corresponding channel 60 so that the die 52 in the recess accessed by that channel 60 may be removed.

Resilient pads 66 at the bottoms of recesses 56 cushion dice 52 and provide a tight seal between dice 52 and the bottom surfaces of recesses 56 when channels 60 are evacuated. Pads 66 include apertures 68 above the upper ends of channels 60 to permit the vacuum in the channels to pull down on dice 52.

As depicted in FIG. 6, carrier base 54 includes an upper panel 70 containing the recesses 56 and containing vertical portions of channels 60. Carrier base 54 also includes a lower panel 72 containing horizontal portions of channels 60 and valve header 64. A set of bolts 74 (or other suitable types of connectors) hold upper and lower panels together, and an O-ring 76 surrounding channels 60 provides an air tight seal between the two panels.

An optional thermostatically-controlled electrical heating element 73 receiving power via a cable 75 may be attached to upper panel 70. Heating element 73 may be employed to supply heat to base 54 to keep dice 52 residing in the base at a desired operating temperature during testing. Element 73 may also be a cooling element for cooling dice 52 during testing.

Figure 7:
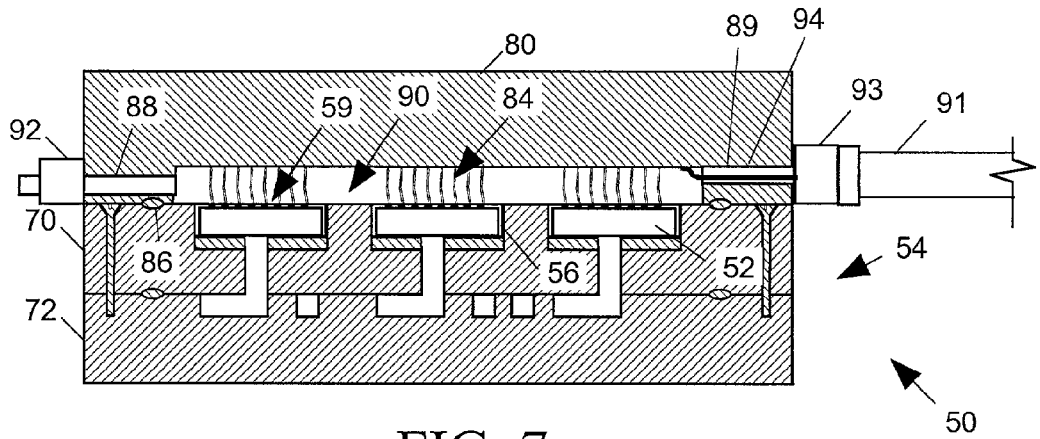
FIG. 7 is a section elevation view of the carrier of FIG. 4 and probe lid mounted on the carrier providing external test equipment with signal access to dice held in the carrier.

FIG. 7 illustrates a removable lid 80 that may be placed on carrier base 54. Lid 80, suitably formed of semiconductor substrate material, holds a set of probes 84 arranged to contact the pads 59 on the upper surfaces of dice 52 when lid 80 is placed on carrier 50. Another O-ring gasket 86 surrounding recesses 56 provides an air tight seal between lid 80 and upper panel 70. A channel 88 through lid 80 links the space 90 formed between lid 80 and upper panel 70 to another vacuum inlet valve 92 that may be connected to a vacuum pump (not shown). A pair of guide pins 85 (FIG. 4) extend upward from top plate 70 into holes (not shown) in the lower surface of lid 80 to ensure that when lid 80 is placed on top plate 70 probes 84 contact their corresponding pads 59 on the upper surfaces of dice 52. After placing lid 80 on upper plate 70, valve 92 is opened to allow the vacuum pump to create a vacuum in space 90 for holding lid 80 in place. When valve 92 is thereafter closed, space 90 remains evacuated even when the vacuum pump is disconnected from valve 92, and the vacuum therein continues to hold lid 80 in place until valve 92 is later reopened. The vacuum in channels 60 should be stronger than the vacuum in space 90 to keep dice 52 in place.

A channel 94 within lid 80 provides a path for conductors 89 extending between lid 80 and a connector 93 for a cable 91 leading to an integrated circuit tester. Traces and vias (not shown) residing on and extending through layers of substrate material forming lid 80 link the conductors passing though channel 94 to the probes 84 formed on the under surface of the substrate. Probes 84, the traces and vias through lid 80, conductors 89 within channel 94 and cable 91 provide signal paths between the pads 59 on the upper surfaces of IC dice 52 and an integrated circuit tester. Although shown on the side of lid 80 in FIG. 7, connector 93 may be conveniently located anywhere on the side or top of lid 80 or on upper or lower panels 70, 72.

Since carrier 50 may be subjected to a wide range of temperatures during testing and during the burn-in processes, lid 80 and plates 70 and 72 are preferable constructed of materials having substantially similar coefficients of thermal expansion so that probes 84 remain in contact with pads 59 on the surfaces of ICs 52 even though ICs 52 may move apart due to thermal expansion of the carrier. When pads 59 are small and densely packed it is preferable to form lid 80 of semiconductor, ceramic or other material having the same coefficient of thermal expansion as the semiconductor material forming ICs 52 so that when ICs 52 expand with increasing temperature, thereby causing pads 59 to move apart, similar expansion of lid 80 causes probes 59 to move apart at the same rate as pads 59. However in many applications such expansion or contraction of ICs 52 would not significantly affect the alignment of probes 84 and pad 59 even when ICs 52 and lid 80 are formed of materials having somewhat different coefficients of thermal expansion.

Figure 8:
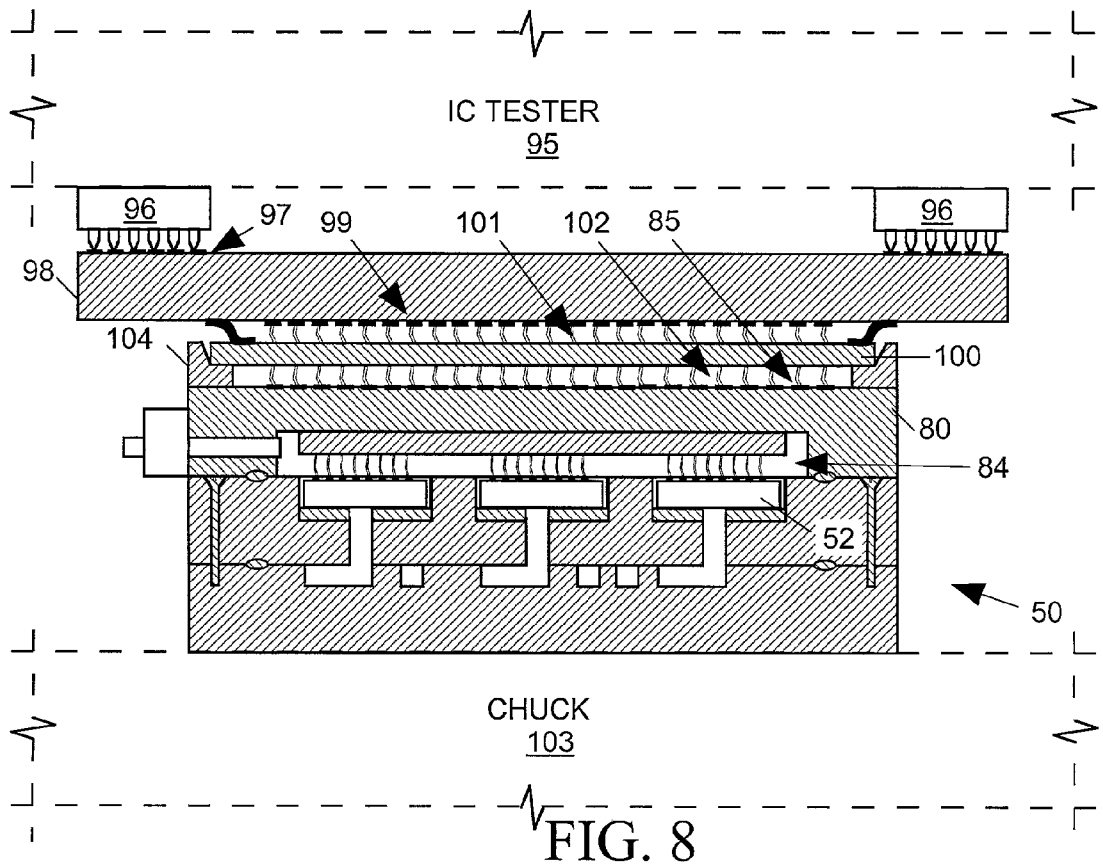
FIG. 8 is a sectional elevation view of the carrier of FIG. 6, held on a chuck and a probe lid mounted on the carrier for proving an integrated circuit tester with signal access to dice held in the carrier via a probe board assembly and an interposer.

In lieu of providing signal paths between probes 84 and a cable 91 leading to an IC tester, lid 80 can be adapted as illustrated in FIG. 8 to provide signal paths between probes 84 and a set of pads 85 on the surface of lid 80 accessed by an IC tester 95. A set of pogo pin connectors 96 contact pads 97 on the upper surface of a printed circuit load board 98 including traces and vias linking pads 97 to another set of pads 99 on the lower surface of load board 98. An interposer board 100 includes one set of spring contacts 101 on its upper surface for contacting the pads 99 on the lower surface of load board 98, another set of spring contacts 102 for contacting the pads 85 on the upper surface of lid 80, and vias providing signal paths between spring contacts 101 and 102. A chuck 103 raises carrier 50 into place under interposer 100 to bring spring contacts 102 into contact with pads 85. A compression stop 104 formed on the surface of lid 80 nudges interposer 100 into proper alignment with lid 80 as pads 85 approach spring contacts 102.

Figure 9:
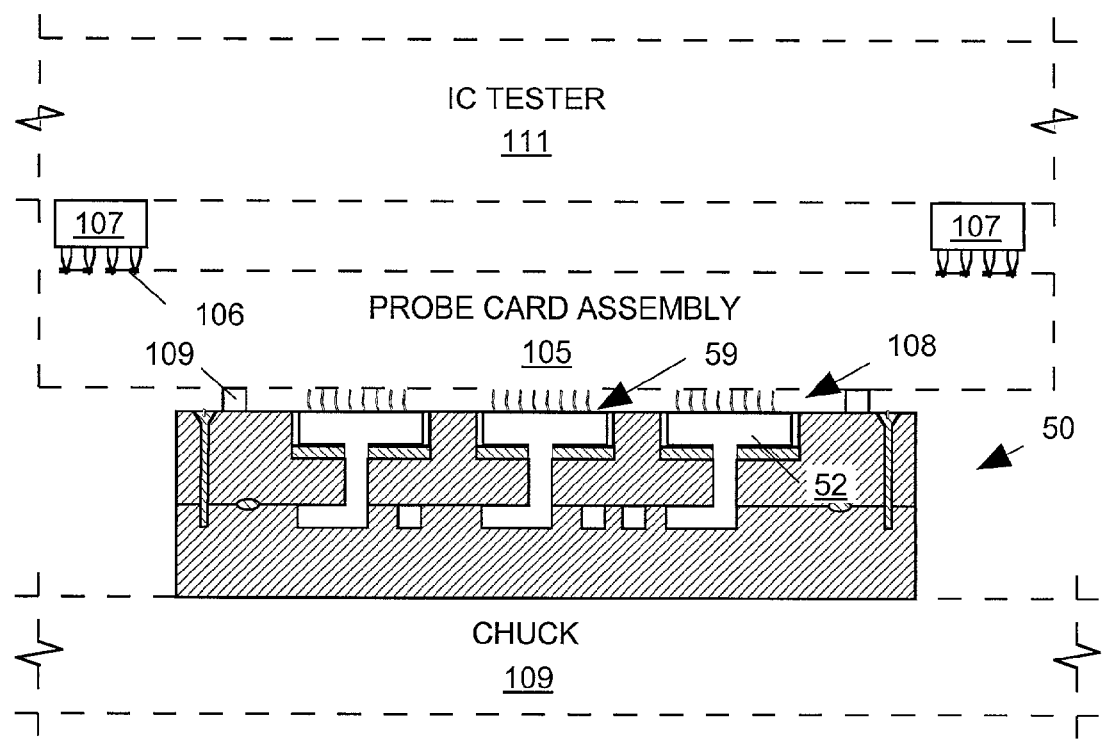
FIG. 9 is a sectional elevation view of the carrier of FIG. 6 held on a chuck with dice held in the carrier being accessed by integrated circuit tester via a probe card assembly.

As illustrated in FIG. 9, with no lid installed, carrier 50 can be used to hold dice 52 while being probed by a probe card assembly 105 similar to probe card assemblies normally employed to provide signal paths between an IC tester and pads on surfaces of IC dice formed on a wafer that are not yet separated from one another. U.S. Pat. No. 5,874,662 issued Nov. 2, 1995 to Eldridge et al, incorporated herein by reference, discloses a wafer level probe card assembly those of skill in the art will appreciate can be adapted for use in testing an array of singulated dice held in a carrier 50. Probe card assembly 105 includes a set of contact pads 106 on its upper surface contacted by pogo pin connectors 107 extending downward from tester 111. Probes 108 formed on the lower surface of probe card assembly 105 contact the pads on the upper surface of ICs 52. Probe card assembly 105 includes one or more substrate layers providing vertical and horizontal signal paths linking pads 106 to probes 108. A chuck 109 appropriately positions carrier 50 under probes 108 so that the probes contact IC pads 59. A perimeter lip 109 mounted on carrier 50 (or on probe board assembly 105 acts as a compression stop when chuck 109 lifts carrier 50 into place under probes 108.

Since wafers typically include more dice than can be tested concurrently, a chuck that holds a wafer under a probe card assembly during a test typically repositions the wafer after each group of dice have been tested so that a next group of dice on the same wafer can be tested. Similarly when carrier 50 holds more dice 52 than the IC tester can concurrently test, chuck 109 must be capable of accurately placing carrier 50 in more than one position relative to probes 108, though a chuck that can do that is complicated and expensive. One of the advantages of using carrier 50 to hold dice 52 as they are being tested rather than testing them while still in wafer form, is that the carrier can be sized to hold only as many dice as the tester can concurrently test. This reduces the cost of chuck 109 because it need not be capable of placing carrier 50 in several different positions relative to probes 108.

Figure 10:
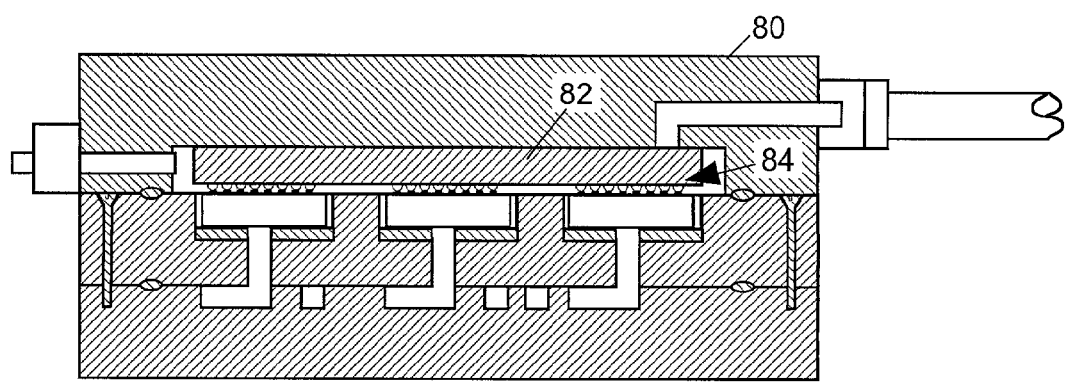
FIG. 10 is a sectional elevation view of a die carrier in accordance with another exemplary embodiment of the invention.

Although the exemplary embodiments of the invention illustrate in FIGS. 7 and 8 illustrate the use of wire bond spring contacts as probes 84, various other types of interconnect structures can be used to implement probes 84 including, for example, lithographic spring contacts, needle probes, cobra probes, and conductive bumps formed of flexible polysilicon and/or other materials. For example, FIG. 10 illustrates an exemplary embodiment of a carrier in accordance with the invention that is generally similar to carrier 50 of FIG. 7 except that probes 84 are implemented by flexible conductive bumps formed on the lower surface of a semiconductor substrate 82 attached to the lower side of lid 80.

Spring contacts are particularly well-suited for use as probes 84 because their flexibility allows them to accommodate normal variations in heights of IC pads 59. Spring contacts can provide more reliable electrical connection to pads 59 than many other types of probes because their tips tend to scratch through any oxide layers that may form on the surfaces of pads 59. Also the impedance characteristics of spring contacts can be tightly controlled to match impedance characteristics of the interconnect systems that will later be used to link the pads to external circuits in their intended operating environments.

The following documents, incorporated herein by reference, disclose various methods for manufacturing spring contacts: U.S. Pat. No. 6,064,213 issued May 16, 2000 to Khandros, et al, U.S. Pat. No. 6,336,269 issued Jan. 8, 2002 to Eldridge et al., U.S. patent application Ser. No. 09/023,858 filed Feb. 13, 1998 and U.S. patent application Ser. No. 09/710,539 filed Nov. 9, 2000 and U.S. patent application Ser. No. 09/746,716 filed Dec. 22, 2000.

Some ICs include interconnect structures such as, for example, spring contacts, conductive bumps or solder balls that are formed on the IC's on their signal pads. These interconnect structures are used to provide signal paths to external devices when the ICs are installed in their intended operating environments. When ICs 52 include such interconnect structures, probes 84 of FIG. 7 may be replaced by conductive pads formed on the lower surface of lid 80 linked through vias, traces, conductors and cables to the IC tester. Such pads on the lower surface of substrate 82 are positioned so that they will be contacted by the interconnect structures formed on dice 52 when lid 80 is set in place on base 70.

Figure 11:
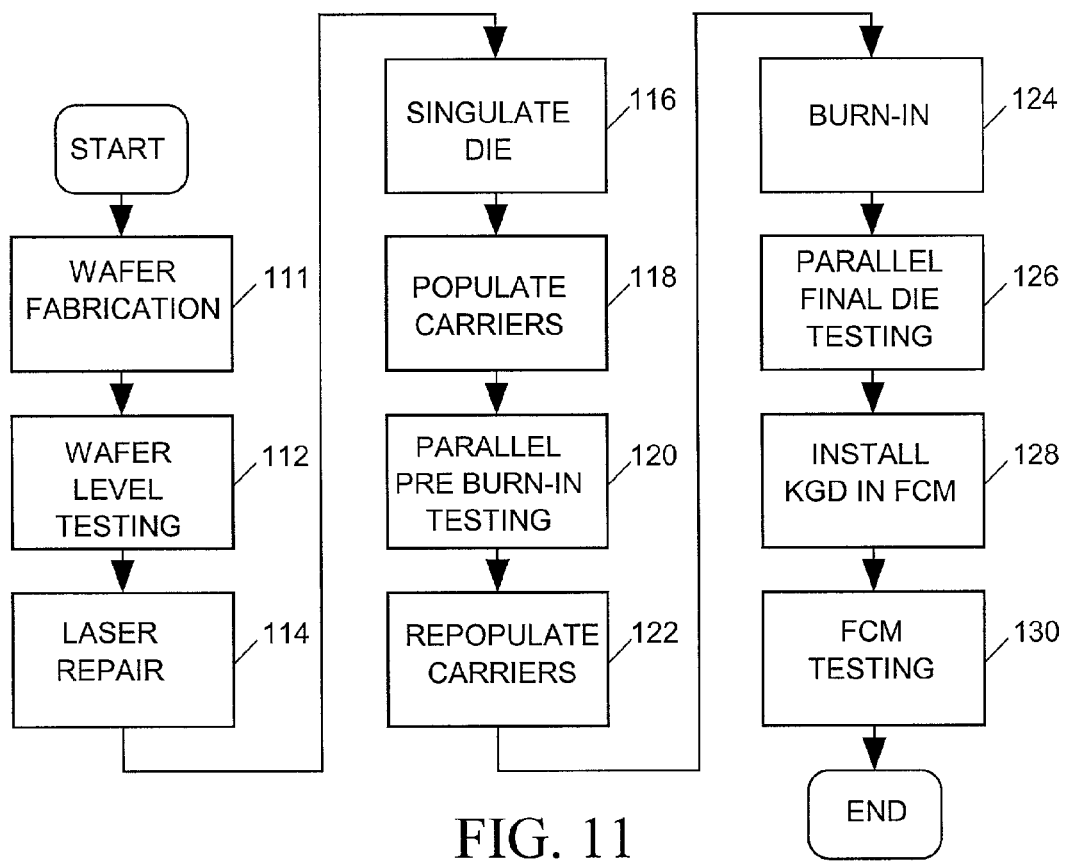
FIGS. 11 and 12 are process flow diagrams illustrating processes in accordance with exemplary embodiments of the invention for producing known good dice to be installed in flip-chip modules.

Testing and processing singulated dice 52 while held in carrier 50 as opposed to testing and processing dice while still in wafer form, can facilitate more efficient use of tester resources. FIG. 11 is a flow chart illustrating a process of fabricating and testing dice wherein a carrier in accordance with the invention is employed to hold singulated dice during the testing process. Referring to FIG. 11, after wafer fabrication (step 111), wafer level testing (step 112) and laser repair (step 114), the dice are singulated (step 116) and only the dice that pass the wafer level tests at step 112 or which can be repaired at step 114 are placed in carriers (step 118). The dice held in the carriers are then subjected to pre burn-in testing (step 120). The carriers may then be repopulated (step 122) so that they containing only those dice that pass the pre burn-in test. After burn-in processing (step 124) the dice are subjected to final dice testing (step 126). At that point only the known good dice (KGD) that passed final testing at step 126 may be installed in flip chip modules (FCMs) at step 128. The FCMs are then tested at step 130.

Since only the dice that pass wafer level testing at step 112 are placed in the carriers at step 118, no tester resources are used at step 120 for testing dice already known to be defective. By repopulating the carriers at step 122 with only those dice that passed the pre burn-in test at step 120, no burn-in or testing resources are used at steps 124 and 126 to process dice already known to be bad.

Figure 12:
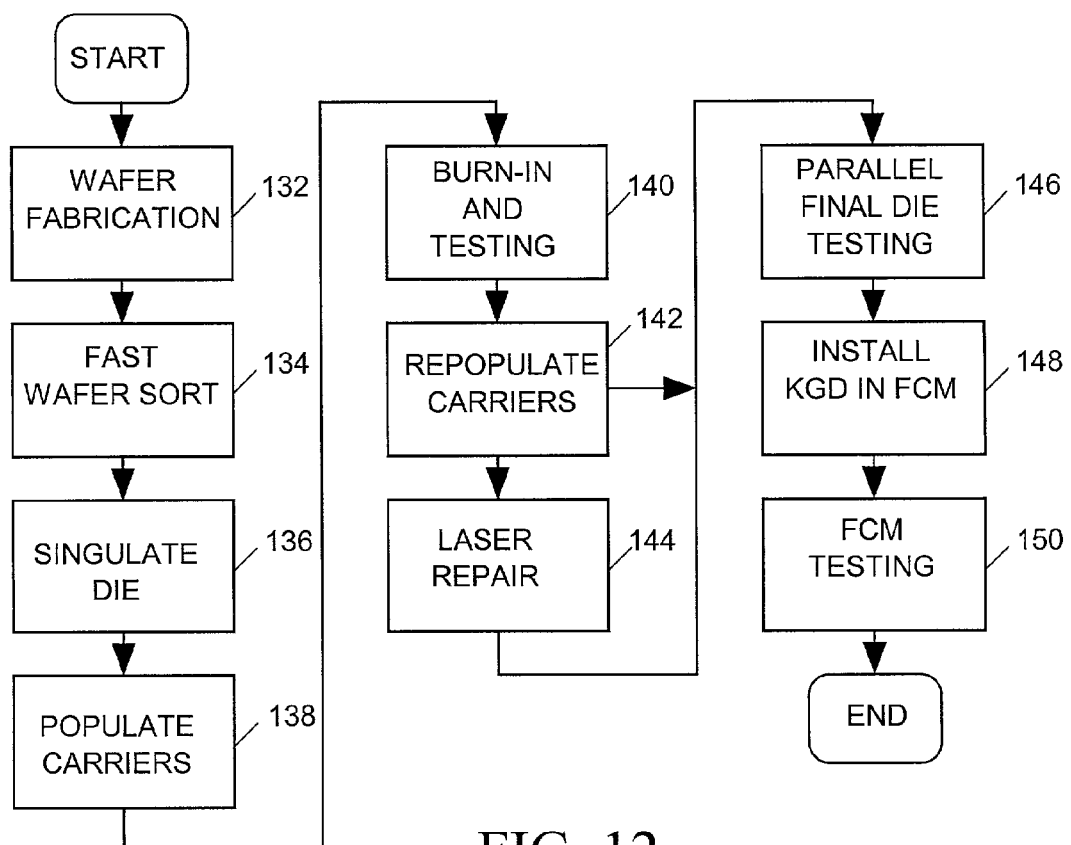

FIG. 12 illustrates an alternative IC process flow employing carriers for holding singulated dice. After wafer fabrication (step 132), a set of "fast sort" tests (step 134) are carried out at the wafer level. The fast sort tests include tests that can be carried out quickly at the wafer level such as, for example, parametric tests and tests that identify ICs having input terminals that are shorted to power, ground or other potential sources though low impedance paths. The dice are then singulated (step 136), and the dice that passed the fast wafer sort tests are placed in carriers (step 138). The dice are then subjected to the burn-in process (step 140), and as part of electrically exercising the dice during burn-in, the die's embedded memories are tested to determine which cells may be defective.

After burn-in and memory testing, the dice are sorted and the carriers repopulated (step 142). Die having defective memories that cannot be repaired are discarded. Die having memories that can be repaired, and dice having memories that do not need to be repaired are placed in separate carriers. The dice having memories needing repair are then repaired at step 144. All repaired dice and dice not needing repair then subjected to final testing at step 146. At that point only the KGD that passed final testing at step 146 may be installed in flip chip modules (FCMs) at step 148. The FCMs are then tested at step 150. With the carriers being populated and repopulated at steps 138 and 142 to eliminate dice known to be defective and unrepairable, and with dice needing repair being segregated from dice not needing repair at step 142, the process makes efficient use of burn-in, testing and laser repair resources at steps 140, 144 and 146.

When not many dice in a carrier are found to be defective at testing step 120 of FIG. 11 or step 140 of FIG. 12, the time and resources needed to sort the dice and repopulate the carriers at step 122 or step 142 may not be justified by the resulting increase in efficiency in use of testing and other resources. Thus the processes may be configured to bypass carrier repopulation steps 122 and 142 except when the number of defective dice in a carrier exceeds a threshold level.

Figure 13:
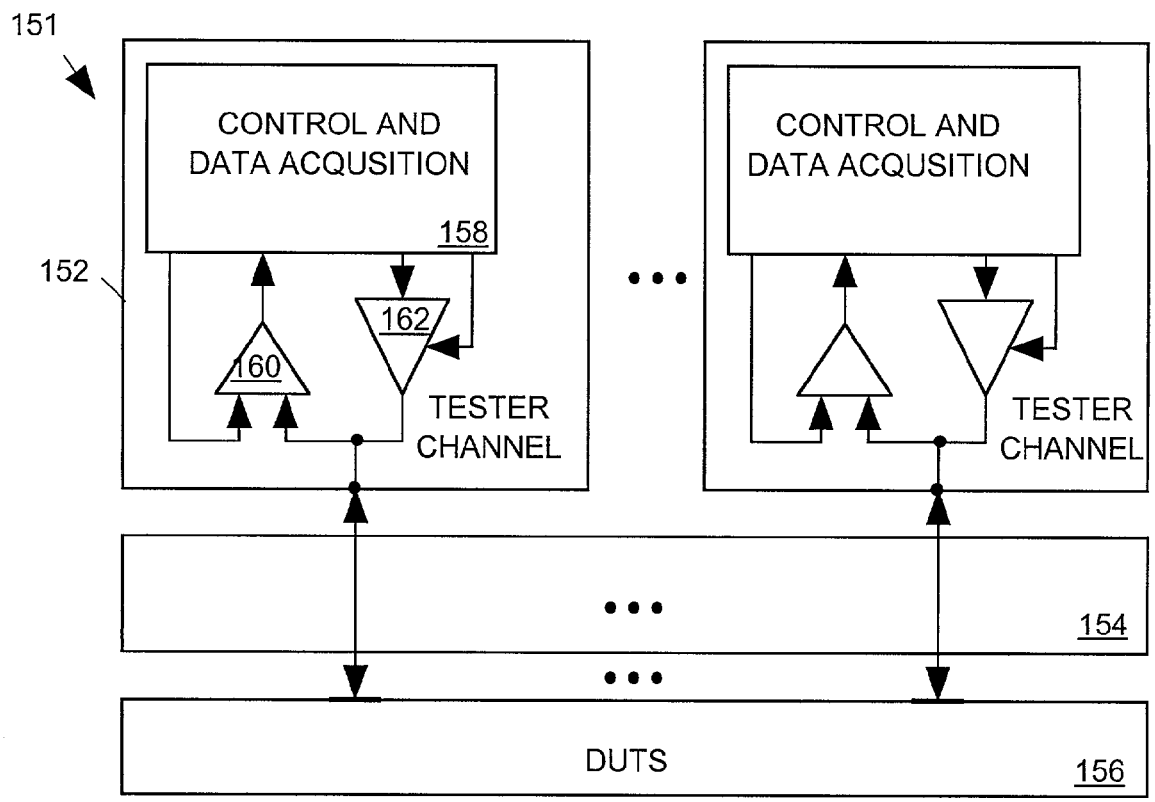
FIG. 13 is a block diagram illustrating how a some prior art interconnect systems link each channel of an integrated circuit (IC) tester to a separate pad of an IC device under test.

As illustrated in FIG. 13, a typical prior art IC tester 151 typically includes a set of tester channels 152, each connected through an interconnect system 154 to a separate terminal of a set of dices under test (DUTs) 156. Each channel 152 includes a control and data acquisition system 158 for alternatively sending a test signal input to a terminal of a dice under test (DUT) via a tristate buffer 160 or sampling the output of a comparator 162. Comparator 162 compares a DUT output signal to a reference voltage to produce an output signal indicating whether the DUT output signal is of a high or low logic level.

When several similar DUTs 156 are being concurrently tested, tester channels 152 sends similar signals to corresponding input terminals of all of the DUTs 156. For example when nine DUT's 156 are being tested, and each has eight input terminals, then a set of 72 (9×8) channels 152 are needed to supply input signals to DUTs 156 during the test, with each set of channels producing a similar set of eight input signals.

Figure 14:
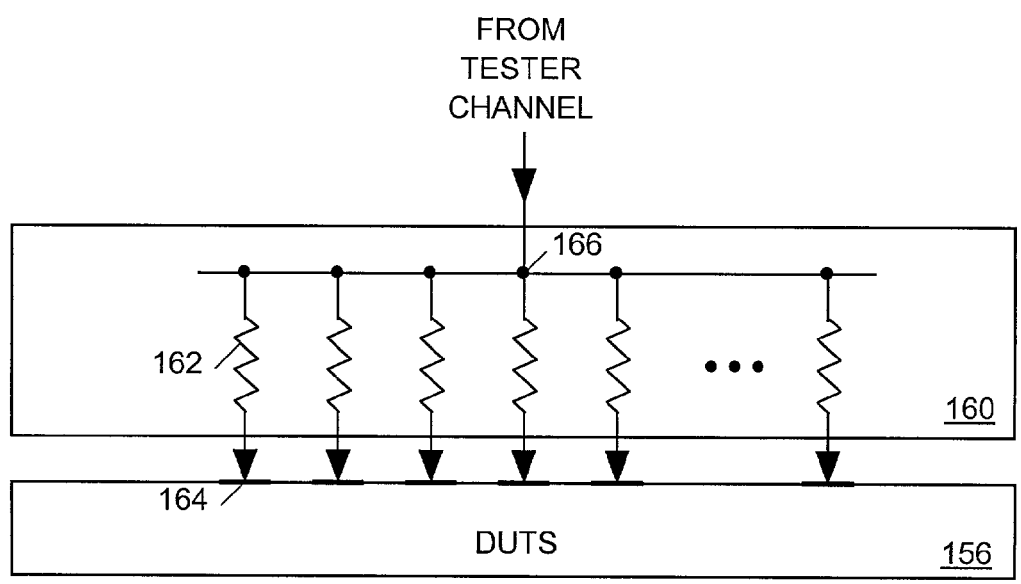
FIG. 14 is a block diagram illustrating how some prior art interconnect systems link one tester channel concurrently to pads of more than one IC device under test.
Figure 15:
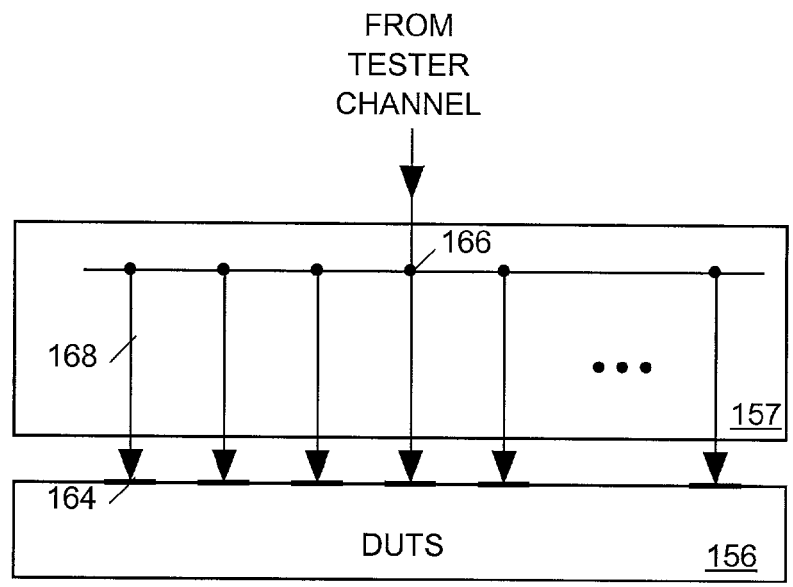
FIG. 15 is a block diagram illustrating how a carrier in accordance with one embodiment of the invention links one tester channel currently to pads of more than one IC device under test.

FIG. 14 illustrates a prior art interconnect system 160 that permits one tester channel to send the same test signal as input to corresponding inputs of several DUTs 156. Interconnect system 160 provides a separate isolation resistor 162 linking each DUT input terminal 164 to a common node 166. Resistors 162 are needed to isolate node 166 from a fault that might link at any terminal 164 to a source of potential (such as power or ground, through a low impedance path. The DUT input terminals 164 are normally high impedance. Such an interconnect arrangement may be provided by including the resistors in the signal paths formed within lid 80 of FIG. 7, within load board 100 of FIG. 8 or within probe card assembly 105 of FIG. 9. However when the fast wafer sort testing carried out at step 134 of FIG. 10 includes testing to determine whether any of the input terminals of the dice are connected to voltage sources through low impedance paths, and when all such dice are discarded before carriers are populated at step 138, then the interconnect arrangement 157 of FIG. 15 may be implemented by lid 80 (FIG. 7), load board 100 (FIG. 8) or probe board assembly 105 (FIG. 9) to link one tester channel to corresponding input terminals 164 of several DUTs 156. As illustrated in FIG. 15, corresponding dice input terminals 164 are directly linked to a common node 166 through a low resistance path 168. Since DUTs 156 populating the carriers were previously tested at the fast wafer sort stage (134) and determined to be free of low impedance faults at input terminals 164, it is not necessary to provide isolation resistors in signal paths 168 when linking more than one DUT terminal to the same tester channel.

Figure 16:
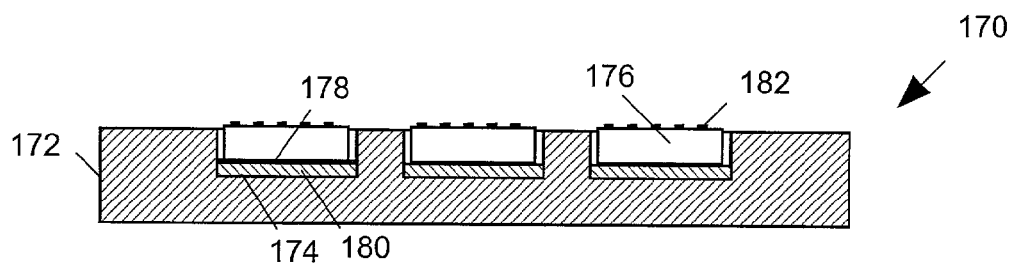
FIG. 16 is a sectional elevation view of a die carrier in accordance with another exemplary embodiment of the invention.

FIG. 16 is a sectional elevation view of a carrier 170 in accordance with another exemplary embodiment of the invention having a base 172 including an array of recesses 174 for holding dice 176. Adhesive 178 (e.g., a sticky gel) temporarily bonds dice 176 to resilient pads 180 residing under dice 176 after a die pick machine has placed dice 176 in position on pads 180 with their pads 182 properly aligned with alignment marks (not shown) on the surface of base 172. Carrier 170 may be fitted with a lid similar to lid 80 of FIG. 7 for providing signal access to the pads 182 on the surface of dice 176. Alternatively a probe card assembly similar to that shown in FIG. 8 may be used to provide tester access to pads 182.

Figure 17:
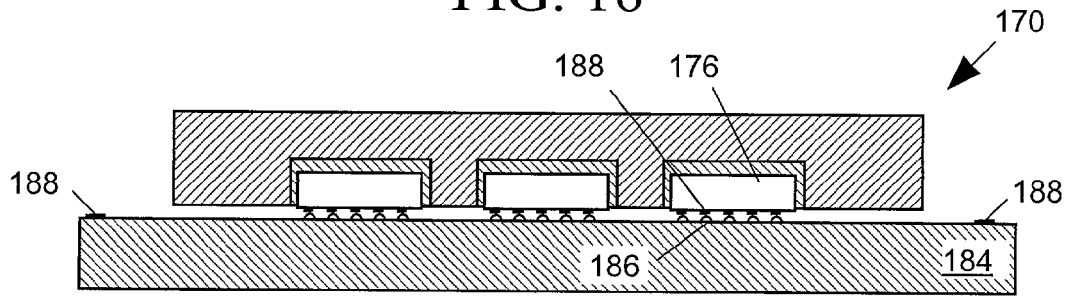
FIG. 17 is a sectional elevation vie of the die carrier of FIG. 16 placed on a load board.

FIG. 17 illustrates carrier 170 of FIG. 16 being inverted and placed on a load board 184 formed by a substrate upon which resilient conductive bumps 186 are arranged to contact the pads 182 on the surface of the dice 176 held in carrier 170. Traces (not shown) formed on load board 184 link bumps 186 to pads 188 on the surface of load board that may be accessed by and integrated circuit tester.

Figure 18:
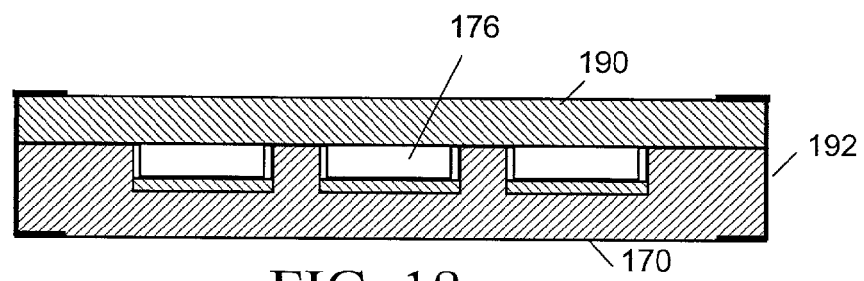
FIG. 18 is a sectional elevation view of the die carrier of FIG. 16 upon which a removable cover has been installed to enclose the die therein.

As illustrated in FIG. 18, after the dice 176 held in carrier 170 have been tested, carrier 170 of FIG. 16 can be used as a shipping container by placing a lid 190 over the FIG. 16. Clips 192 or other attachment means are be provided to hold lid 190 in place during shipment. Carrier 54 of FIG. 6 can also be used as a shipping container when fitted with a similar lid.

Figure 19:
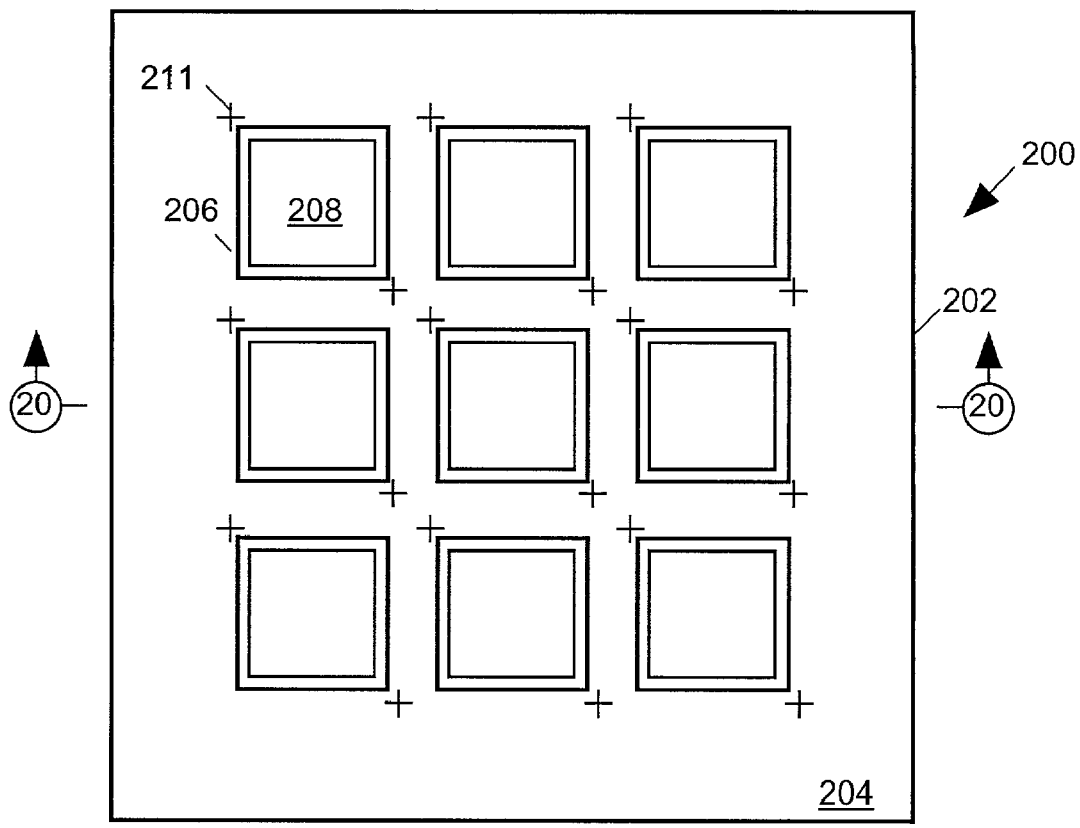
FIG. 19 is a plan view of a die carrier in accordance with another exemplary embodiment of the invention.
Figure 20:
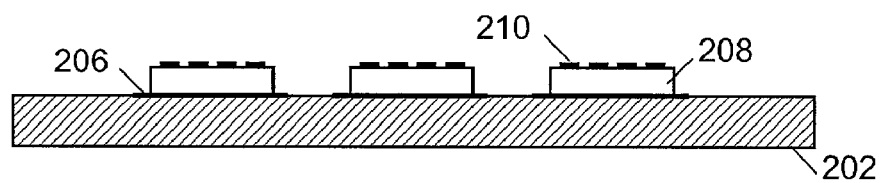
FIG. 20 is a sectional elevation view of the die carrier of FIG. 19.

FIGS. 19 and 20 illustrate another exemplary embodiment of a carrier 200 in accordance with the invention including a base 202 having a planar upper surface 204 upon which are mounted an array of resilient pads 206. A die pick machine positions die 208 on pads 206 so that signal input/output pads 210 formed on the upper surfaces of dice 208 reside at predetermined locations within a common plane relative to landmarks 211 etched on the surface 204 of base 202. Adhesive temporarily holds dice 208 in place on pads 206 but allows the die pick machine to lift dice 208 off pads 206 after they have been tested. For simplicity carrier 200 is illustrated as being sized to hold a 3×3 array of dice 208, however it can be sized to hold larger or smaller arrays of dice. The dice 208 mounted on carrier 200 could be subjected to a sequence of testing and burn-in processing step using equipment substantially similar to equipment used subject dice that are sill in wafer form to a similar sequence of processing steps. However while all dice on a wafer must be subjected to each processing step, a die pick machine can replace any die 208 mounted on carrier 200 that fails any processing step with another die before the dice are subjected to a next processing step, thereby increasing the efficiency of processing equipment use.

Figure 21:
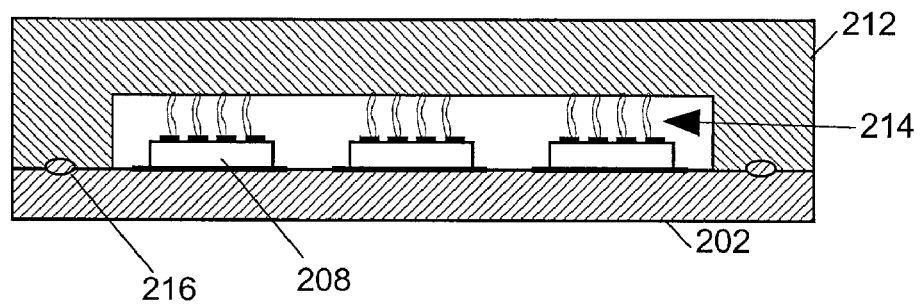
FIG. 21 is a sectional invention view of the die carrier of FIG. 19 and a probe lid covering the carrier.

Alternatively, as illustrated in FIG. 21, carrier 200 may include a removable lid 212 including probes 214 for accessing the pads on the surface of die 208. Cover 212 may be held on carrier base 202 by partially evacuating the space between the lid and the base when suitable gaskets 216 are provided between lid 212 and base 202. Traces and vias extending through lid 212 may extend for example, to contact pads (not shown) on the surface of lid 212 or to cable connectors (not shown) attached to the surface of lid 212, to provide external test equipment with signal access to probes 214. Probes 214 may either be attached to base 212 or to the signal pads the surfaces of die 208. In lieu of using adhesive to bond die 208 to pads 206, vacuum channels (not shown) within base 202 similar to those of base 54 of carrier 50 of FIG. 6 may be provided to hold die 208 in place.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. An apparatus for holding devices to be tested comprising:
   a plurality of probes disposed in a first pattern and attached to a substrate; and
   a carrier for supporting a plurality of singulated semiconductor dies, the carrier being a distinct and different structure than the dies and including a plurality of landmarks, wherein while the dies are disposed on the carrier in predefined orientations with respect to the landmarks, terminals of the dies are disposed in a second pattern that is generally the same as the first pattern, wherein:
   the probes are organized into probe groups each comprising a sufficient number of probes disposed in a layout to contact at least some of the terminals of one of the dies, and
   while the dies are disposed on the carrier in the predefined orientations and the substrate is aligned with the carrier, the at least some of the terminals of each of the dies align sufficiently with the probes of one of the probe groups for the probes of the one of the probe groups to contact directly the at least some of the terminals of the die.

2. The apparatus of claim 1, wherein the landmarks comprise optical alignment marks used by a die pick machine to place the dies in the predefined orientations on a base of the carrier.

3. The apparatus of claim 1, wherein the landmarks comprise marks etched into a base of the carrier.

4. The apparatus of claim 1, wherein at least one of the landmarks comprises at least one identifiable location on an alignment die placed on the carrier before the dies.

5. The apparatus of claim 1, wherein the substrate comprises a material that has substantially the same coefficient of thermal expansion as material in the dies.

6. The apparatus of claim 1, wherein material in the carrier has substantially the same coefficient of thermal expansion as material in the dies.

7. The apparatus of claim 1, further comprising:
   channels provided in the carrier for applying a vacuum to hold the dies in the predefined orientations; and
   pads under the dies to cushion the dies and to provide seals for the dies when the vacuum is applied to the channels.

8. The apparatus of claim 1, further comprising:
   an adhesive provided on the carrier for holding the dies in the predefined orientations.

9. The apparatus of claim 1, wherein the carrier includes a base with recesses where the dies are supported.

10. The apparatus of claim 1, wherein the probes comprise spring contacts.

11. The apparatus of claim 1, wherein the carrier includes at least one landmark for each die.

12. The apparatus of claim 1, wherein the carrier comprises a base, and wherein dies are located on the base in a common horizontal plane relative to each other and to the landmarks.

13. The apparatus of claim 1, wherein while the dies are disposed on the carrier in the predefined orientations, the dies form a grid array pattern.

14. The apparatus of claim 1, wherein while the dies are disposed on the carrier in the predefined orientations, the dies contact the carrier without contacting an intervening adhesive material.

15. The apparatus of claim 1, wherein the singulated dies are individual dies singulated from the semiconductor wafer on which the dies were made.

16. The apparatus of claim 1 further comprising channels provided in the carrier for applying a vacuum to hold the dies in the predefined orientations.

* * * * *